United States Patent
Tamura

(10) Patent No.: US 8,431,830 B2
(45) Date of Patent: Apr. 30, 2013

(54) INTERPOSER AND ELECTRONIC DEVICE

(75) Inventor: Akira Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 12/884,701

(22) Filed: Sep. 17, 2010

(65) Prior Publication Data

US 2011/0073355 A1 Mar. 31, 2011

(30) Foreign Application Priority Data

Sep. 28, 2009 (JP) ................................. 2009-223178

(51) Int. Cl.
*H05K 1/03* (2006.01)

(52) U.S. Cl.
USPC ............................ 174/255; 174/250; 174/256

(58) Field of Classification Search .................. 174/255, 174/250, 256
See application file for complete search history.

(56) References Cited

U.S. PATENT DOCUMENTS

| 6,799,977 | B2 | 10/2004 | Liu |
| 7,654,827 | B2* | 2/2010 | Arai et al. ........................ 439/66 |
| 2004/0203268 | A1* | 10/2004 | Nishizawa ...................... 439/91 |
| 2009/0325415 | A1* | 12/2009 | Brist et al. .................... 439/330 |

FOREIGN PATENT DOCUMENTS

| JP | 09-181228 | 7/1997 |
| JP | 2004-47986 | 2/2004 |

* cited by examiner

*Primary Examiner* — Yuriy Semenenko
*Assistant Examiner* — Andargie M Aychillhum
(74) *Attorney, Agent, or Firm* — Squire, Sanders (US) LLP

(57) ABSTRACT

An interposer for connecting a semiconductor and a circuit board includes an insulating material sheet, a through hole which is formed in the insulating material sheet and an elastic conductive contact which is formed from an elastic conductive sheet and provided in the through hole.

18 Claims, 7 Drawing Sheets

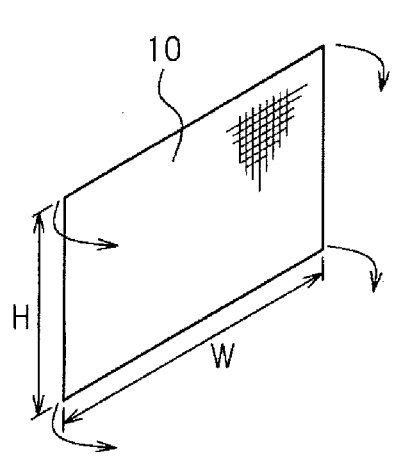
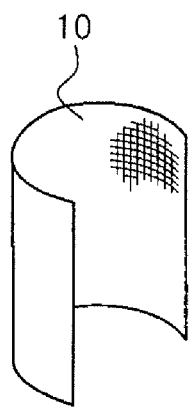
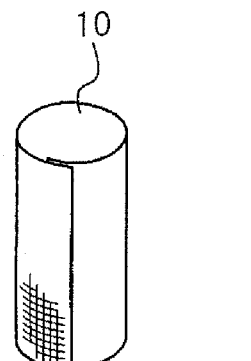
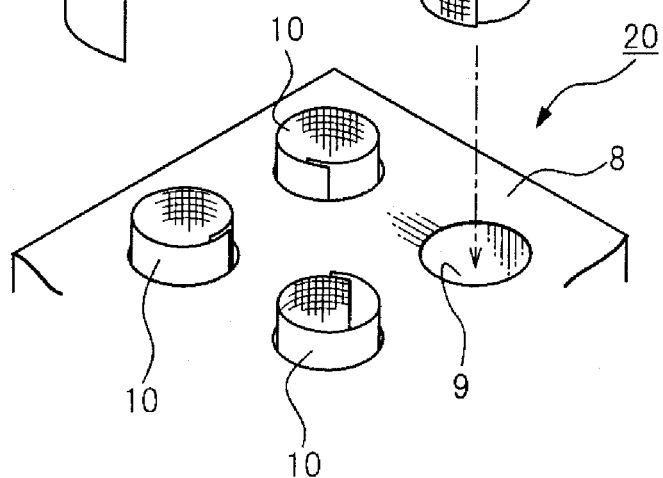
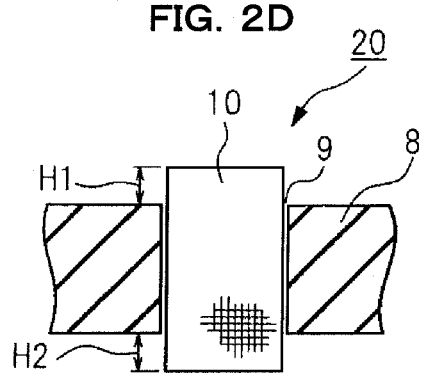
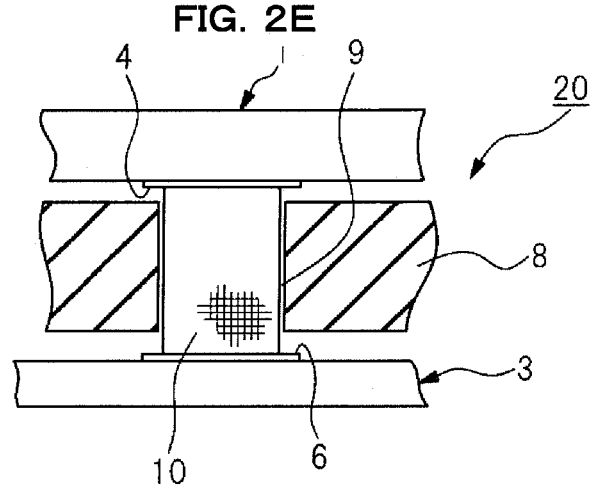

INTERPOSER AND ELECTRONIC DEVICE

CROSS-REFERENCE TO RELATED APPLICATION

This application is based upon and claims the benefit of priority from the prior Japanese Patent Application No. 2009-223178 filed on Sep. 28, 2009, the entire contents of which are incorporated herein by reference.

FIELD

The embodiment discussed herein is related to an interposer and an electronic device.

BACKGROUND

An interposer is used to connect terminal electrodes formed on a bottom surface of an integrated circuit to electrode patterns formed on a substrate in a process of mounting the integrated circuit on the circuit board.

In a related art process of mounting a semiconductor Integrated Circuit (IC) on a circuit board, leads extending from side surfaces of an IC package are inserted in through holes of lands of a circuit pattern formed on the circuit board, and are electrically connected to the lands by soldering. Recently, the number of input/output terminals of the IC is increasing as IC integration density increases. In addition, higher frequency performance is in demand as operating frequency of the IC becomes high. In view of these recent trends, mounting an IC on a circuit board with higher density, with shorter connection distances and with narrower pitches is now increasingly demanded.

In order to meet these demands, a technique has been proposed to mount input/output terminals on a circuit board using an interposer. The input/output terminals are arranged on a bottom surface of an IC package in a grid array pattern, which helps efficiently arrange the input/output terminals. An interposer is a high terminal density thin connector formed of an insulating material sheet having through holes formed at positions corresponding to the input/output terminals of the IC package arranged in a grid array pattern and having electric conductors (i.e., connectors) placed in the through holes for the conduction of the front and back surfaces of the insulation material. Terminal patterns are formed in a similar grid array pattern on the circuit board. Here, mounting of an IC package on a circuit board using an interposer will be described with reference to FIGS. 1A to 1C.

FIG. 1A illustrates an interposer 2 to which the present application is applied being disposed between a circuit board 3 and an IC package 1. FIG. 1B is a side view of FIG. 1A. In FIG. 1B, the interposer 2 is illustrated in cross section. Input/output terminals (i.e., electrodes) 4 are arranged in a grid array pattern on a back surface of the IC package 1. Terminal patterns (i.e., electrodes) 6 are formed at positions opposite to the input/output terminals 4 on the circuit board 3 on which the IC package 1 is to be mounted. Although not illustrated, other circuit patterns and electronic parts are provided on the circuit board 3 for the connection with the terminal patterns 6.

The interposer 2 is disposed between the IC package 1 and the circuit board 3 to connect the input/output terminals 4 formed on the back surface of the IC package 1 to the terminal patterns 6 formed on the circuit board 3. The interposer 2 is a high terminal density thin connector formed of an insulation material sheet (hereinafter, referred to as an interposer substrate) having through holes 9 formed at positions corresponding to the input/output terminals 4 of the IC package 1 arranged in a grid array pattern and having connectors 5 placed in the through holes 9. The connectors 5, which are of the same length, are electric conductors for the conduction of the front and back surfaces of the interposer substrate 8.

Usually, as illustrated in FIG. 1C, the interposer 2 is attached to an inner side of a socket 7, which in turn is mounted on the circuit board 3 by soldering or other means. The socket 7 facilitates mounting and dismounting of the IC package 1 on and from the circuit board 3.

In the thus-configured interposer 2, the structure of the connectors 5 as conductors for the conduction of the front and back surfaces of the interposer substrate 8 is important. The connectors 5, which will be pressed between the input/output terminals 4 formed on the back surface of the IC package 1 and the terminal patterns 6 formed on the circuit board 3, elastically compressed by the pressure from the upper and lower sides for the conduction between the input/output terminals 4 and the terminal patterns 6.

Japanese Laid-open Patent Publication No. 2004-47986 discloses elastic connectors ("electrically conductive contacts" in the Document) that are made of foam metal or a combination of foam metal and an elastomer. Foamed metal is produced by various processes from electrically conductive metals, such as copper, copper alloy, silver, silver alloy, gold, nickel and molybdenum. The foaming process includes: bubbling gas through molten metal, stirring a foaming agent through the molten metal, consolidating metal powder with a particulate foaming agent, pressure infiltrating the molten metal into wax or a foam polymer precursor, and performing a vapor deposition process for the deposition of metal onto the foam polymer precursor.

SUMMARY

According to an aspect of the embodiment, an interposer for connecting a semiconductor and a circuit board includes an insulating material sheet, a through hole formed in the insulating material sheet and an elastic conductive contact formed from an elastic conductive sheet and provided in the through hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is a perspective view illustrating an original shape of a mesh elastic conductive sheet used as an elastic contact according to the present application;

FIG. 2B is a perspective view of the mesh elastic conductive sheet of FIG. 2A which is being rolled up;

FIG. 2C is a perspective view of the assembly of the interposer of the present application illustrating a rolled mesh elastic conductive sheet being placed in one of through holes formed in an interposer substrate;

FIG. 2D is a partially enlarged sectional view of the mesh elastic conductive sheet illustrated in FIG. 2C assembled in the interposer;

FIG. 2E is a partially enlarged sectional view of the interposer illustrated in FIG. 2D connecting a pair of counter electrodes in a compressed state;

DESCRIPTION OF EMBODIMENTS

Figure 1A:
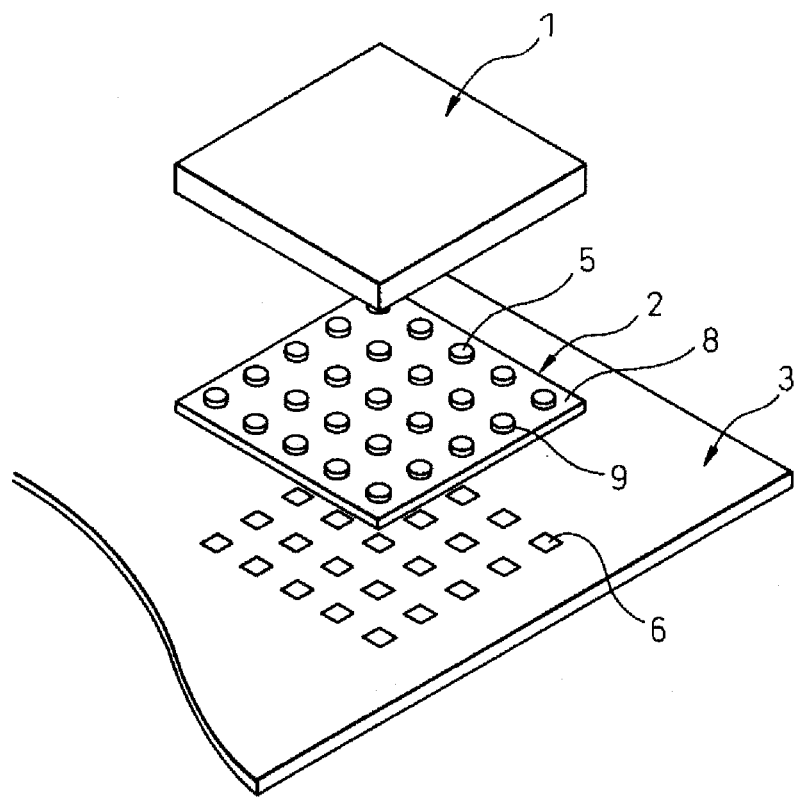
FIG. 1A illustrates an interposer to which the present application is applied being disposed between a circuit board and an IC package.
Figure 1B:
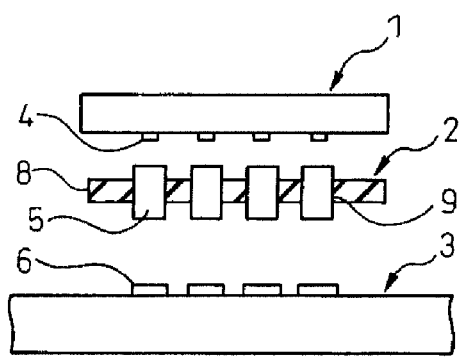
FIG. 1B is a side view, partially cross-sectioned, of FIG. 1A.
Figure 1C:
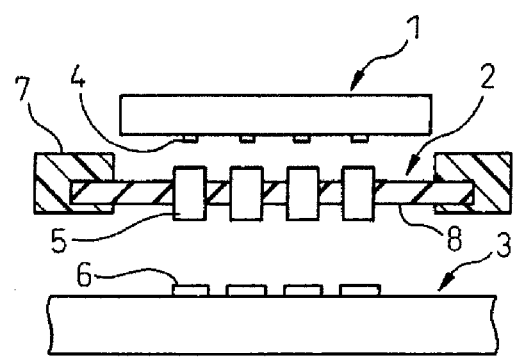
FIG. 1C is a side view in which the interposer illustrated in FIG. 1B is attached to a socket.

Hereinafter, embodiments of an interposer according to the present application will be described in detail along with various examples with reference to the accompanying drawings. The interposer according to the present application has a function similar to that of the interposer 2 disposed between the IC package 1 and the circuit board 3 illustrated with reference to FIGS. 1A to 1C. In the following description, components similar to those illustrated in FIGS. 1A to 1C will be denoted by the same reference numerals.

First, a basic form of the interposer according to the present application will be described with reference to FIGS. 2A to 2E. FIG. 2A illustrates an original shape of a mesh elastic conductive sheet 10 used as an elastic contact in the present application. The rectangular-shaped mesh elastic conductive sheet 10 may be made by etching elastic sheet metal, such as stainless steel. In this example, a width dimension H of the mesh elastic conductive sheet 10 is larger than the thickness of an interposer substrate 8 illustrated in FIGS. 1A to 1C. In this example, a longitudinal length W of the mesh elastic conductive sheet 10 is slightly longer than an inner circumferential length of a through hole 9 formed in the interposer substrate 8 illustrated in FIGS. 1A to 1C.

Longitudinal edges of the mesh elastic conductive sheet 10 illustrated in FIG. 2A are rolled up in one direction as illustrated in FIG. 2B and joined to form a cylinder illustrated in FIG. 2C. The cylindrical mesh elastic conductive sheet 10 is placed in one of the through holes 9 formed in the interposer substrate 8. As described above, since the longitudinal length W of the mesh elastic conductive sheet 10 is slightly longer than the inner circumferential length of the through hole 9, longitudinal edges of the cylindrical mesh elastic conductive sheet 10 slightly overlap each other.

FIG. 2D illustrates an interposer 20 in which the rolled mesh elastic conductive sheet 10 is placed in one of the through holes 9 formed in the interposer substrate 8. Because of its elasticity, the mesh elastic conductive sheet 10 tries to unroll toward an inner circumferential surface of the through hole 9 when placed in the through hole 9. Thus the mesh elastic conductive sheet 10 would not remove from the through hole 9 without any fixing measures. The mesh elastic conductive sheet 10 is placed in the through hole 9 in a manner such that projection height H1 from an upper surface of the interposer substrate 8 and projection height H2 from a lower surface are the same. However, the sameness in the projection heights H1 and H2 are not important because the projection height H1 or H2, whichever is larger, will be pressed first when the interposer 20 is used so that the projection heights H1 and H2 will be the same eventually.

FIG. 2E illustrates the interposer 20 of FIG. 2D with an upper end attached to the IC package 1 and a lower end placed on the circuit board 3. The upper end of the mesh elastic conductive sheet 10 of the interposer 20 is pressed against one of input/output terminals 4 of the IC package 1 and the lower end is pressed against one of terminal patterns 6 on the circuit board 3. The mesh elastic conductive sheet 10 is compressed by the pressure force. Thus the input/output terminal 4 and the terminal pattern 6 are connected to each other via the mesh elastic conductive sheet 10. A current path for the conduction is formed by multiple beams which constitute the mesh elastic conductive sheet 10.

Here, various forms (i.e., examples) of the mesh elastic conductive sheet 10 and the through hole 9 will be described with reference to FIGS. 3A to 3H and 4. In FIGS. 3A to 3H, dashed lines represent the mesh elastic conductive sheet 10, of which edges marked with black circles.

Figure 3A:
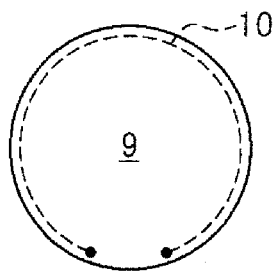
FIG. 3A is a partially enlarged plan view of an example of the interposer placed in one of the through holes in a case in which a longitudinal dimension of the mesh elastic conductive sheet illustrated in FIG. 2A is shorter than an inner circumference of the through hole formed in the interposer substrate.

FIG. 3A illustrates an example in which the longitudinal length W of the mesh elastic conductive sheet 10 illustrated in FIG. 2A is shorter than the inner circumference of the through hole 9. In this case, longitudinal edges of the mesh elastic conductive sheet 10 are disposed with a small gap therebetween. Although such a small gap is acceptable, a too large gap may help collapse the cylindrical mesh elastic conductive sheet 10 when pressed from upper and lower directions.

Figure 3B:
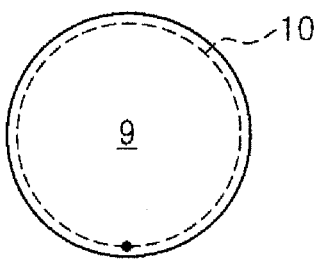
FIG. 3B is a partially enlarged plan view of an example of the interposer placed in one of the through holes in a case in which the longitudinal dimension of the mesh elastic conductive sheet illustrated in FIG. 2A equals to the inner circumference of the through hole formed in the interposer substrate.

FIG. 3B illustrates an example in which the longitudinal length W of the mesh elastic conductive sheet 10 illustrated in FIG. 2A equals to the inner circumference of the through hole 9. In this example, longitudinal edges of the mesh elastic conductive sheet 10 are joined together. In this case, dimensional control is important because the mesh elastic conductive sheet 10 would not try to unroll after being placed in the through hole 9. With the dimensional control, it is not necessary to join the longitudinal edges of the mesh elastic conductive sheet 10 even if the longitudinal length W of the mesh elastic conductive sheet 10 equals to the inner circumference of the through hole 9.

Figure 3C:
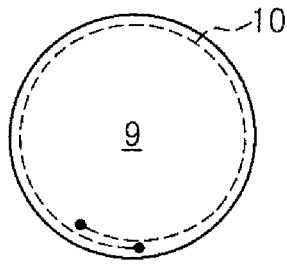
FIG. 3C is a partially enlarged plan view of an example of the interposer placed in one of the through holes in a case in which the longitudinal dimension of the mesh elastic conductive sheet illustrated in FIG. 2A is slightly longer than the inner circumference of the through hole formed in the interposer substrate.

FIG. 3C illustrates an example in which the longitudinal length W of the mesh elastic conductive sheet 10 illustrated in FIG. 2A is slightly longer than the inner circumference of the through hole 9. The example illustrated in FIG. 3C is similar to that illustrated in FIGS. 2A to 2E and description thereof will be omitted.

Figure 3D:
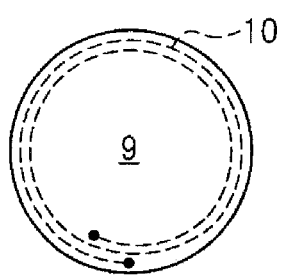
FIG. 3D is a partially enlarged plan view of an example of the interposer placed in one of the through holes in a case in which the longitudinal dimension of the mesh elastic conductive sheet illustrated in FIG. 2A is more than twice as long as the inner circumference of the through hole.

FIG. 3D illustrates an example in which the longitudinal dimension of the mesh elastic conductive sheet 10 illustrated in FIG. 2A is more than twice as long as the inner circumference of the through hole 9. In this case, a double-wide current path is provided between the upper and lower ends of the cylindrical mesh elastic conductive sheet 10, as compared with the examples illustrated in FIGS. 3A to 3C. Such a wider current path has lower resistance values between the upper and lower ends of the cylindrical mesh elastic conductive sheet 10. The double-rolled cylindrical elastic conductive sheet 10 may be obtained by rolling up a single mesh elastic conductive sheet 10 twice as described above or, alternatively, by rolling up two mesh elastic conductive sheets 10 in an overlapped manner.

Figure 3E:
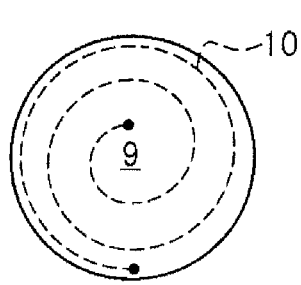
FIG. 3E is a partially enlarged plan view of an example of the interposer formed in a spiral shape and placed in one of the through holes in a case in which the longitudinal dimension of the mesh elastic conductive sheet illustrated in FIG. 2A is more than twice as long as the inner circumference of the through hole formed in the interposer substrate.

FIG. 3E illustrates an example similar to that illustrated in FIG. 3D, in which the longitudinal dimension of the mesh elastic conductive sheet 10 illustrated in FIG. 2A is more than twice as long as the inner circumference of the through hole 9. In the example illustrated in FIG. 3D, the mesh elastic conductive sheet 10 is placed in the through hole 9 in a simply rolled-up manner. In the example illustrated in FIG. 3E, the mesh elastic conductive sheet 10 is formed to have a spiral shape during the rolling up process. Thus the mesh elastic conductive sheet 10 keeps a spiral shape when seen in a plan view.

Figure 3F:
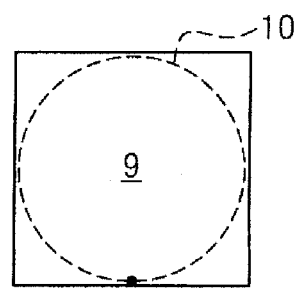
FIG. 3F is a partially enlarged plan view of an example of the interposer placed in a sectionally square-shaped through hole formed in the interposer substrate, in which the longitudinal dimension of the mesh elastic conductive sheet illustrated in FIG. 2A equals to a circumference of an inscribed circle of the square.

FIG. 3F illustrates an example in which the through hole 9 formed in the interposer substrate 8 is square-shaped in cross section. In this case, the longitudinal dimension W of the mesh elastic conductive sheet 10 illustrated in FIG. 2A may equal to the circumference of an inscribed circle of the square. The longitudinal edges of the mesh elastic conductive sheet 10 may or may not be joined together before the mesh elastic conductive sheet 10 is placed in the through hole 9.

Figure 3G:
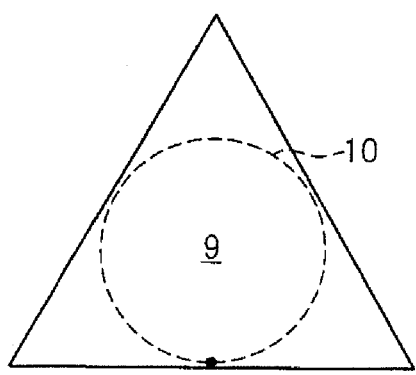
FIG. 3G is a partially enlarged plan view of an example of the interposer placed in a sectionally triangular-shaped through hole formed in the interposer substrate, in which the longitudinal dimension of the mesh elastic conductive sheet illustrated in FIG. 2A equals to a circumference of an inscribed circle of the triangle.

FIG. 3G illustrates an example in which the through hole 9 formed in the interposer substrate 8 is triangular-shaped in cross section. In this case, the longitudinal dimension W of the mesh elastic conductive sheet 10 illustrated in FIG. 2A may equal to the circumference of an inscribed circle of the triangle. The longitudinal edges of the mesh elastic conductive sheet 10 may or may not be joined together before the mesh elastic conductive sheet 10 is placed in the through hole 9.

Figure 3H:
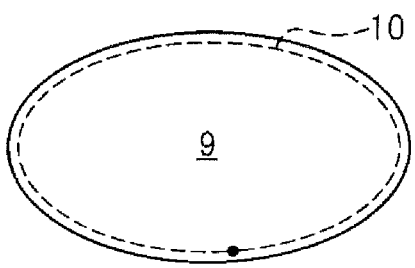
FIG. 3H is a partially enlarged plan view of an example of the interposer placed in a sectionally oval-shaped through hole formed in the interposer substrate, in which the longitudinal dimension of the mesh elastic conductive sheet illustrated in FIG. 2A equals to a circumference of the oval.

FIG. 3H illustrates an example in which the through hole 9 formed in the interposer substrate 8 is oval-shaped in cross section. In this case, the longitudinal dimension W of the mesh elastic conductive sheet 10 illustrated in FIG. 2A may equal to a circumference of the oval. The longitudinal edges of the mesh elastic conductive sheet 10 may or may not be joined together before the mesh elastic conductive sheet 10 is placed in the through hole 9.

Figure 4:
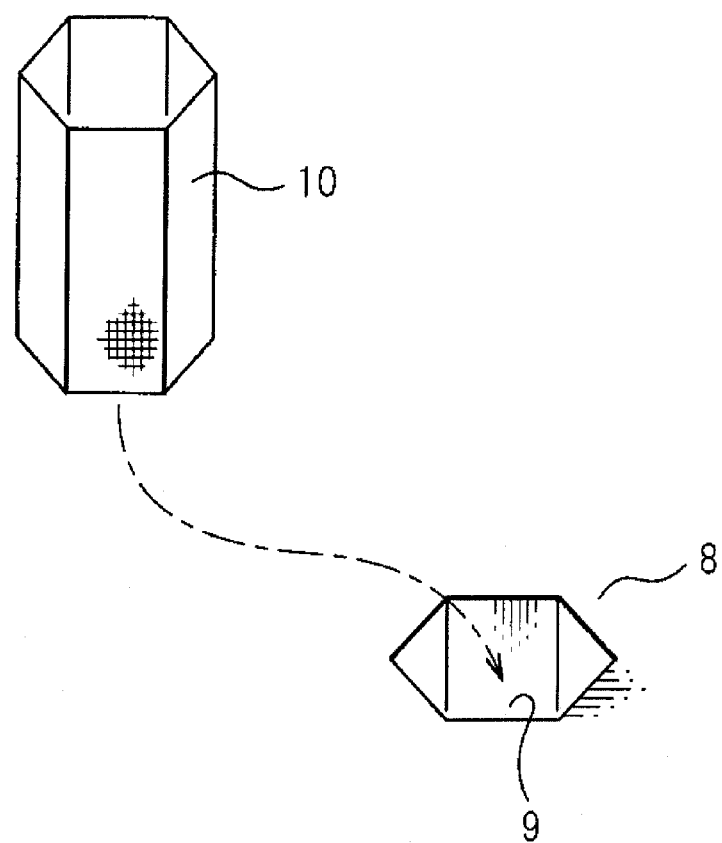
FIG. 4 is a perspective view of the assembly of an example of the interposer to be placed in a sectionally hexagonal-shaped through hole formed in the interposer substrate, in which the longitudinal dimension of the mesh elastic conductive sheet illustrated in FIG. 2A, formed as a hollow hexagonal cylinder, equals to a circumference of the hexagon.

FIG. 4 illustrates an example in which the through hole 9 formed in the interposer substrate 8 is hexagonal-shaped in cross section. In this example, the longitudinal dimension W of the mesh elastic conductive sheet 10 illustrated in FIG. 2A, formed as a hollow hexagonal cylinder and placed in the through hole 9, equals to a circumference of the hexagon. The longitudinal edges of the mesh elastic conductive sheet 10 may or may not be joined together before the mesh elastic conductive sheet 10 is placed in the through hole 9.

Figure 5A:
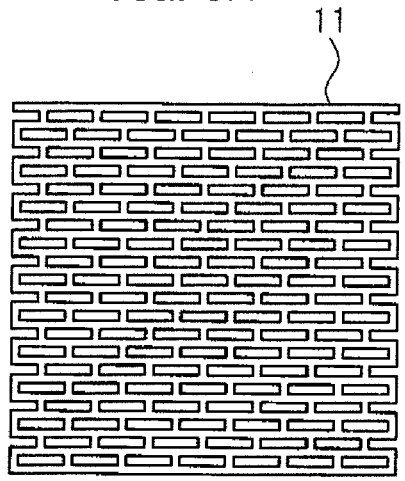
FIG. 5A is a plan view of a mesh structure of the mesh elastic conductive sheet according to a first embodiment.
Figure 5B:
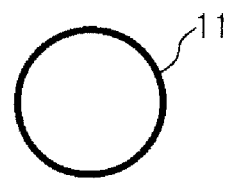
FIG. 5B is a plan view of the mesh elastic conductive sheet illustrated in FIG. 5A which is rolled up and joined at edges to form a cylinder.
Figure 5C:
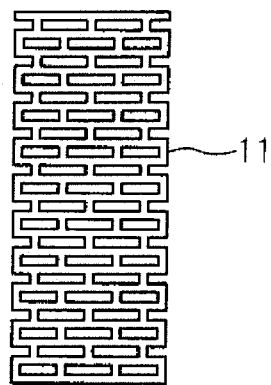
FIG. 5C is a side view of the cylindrical mesh elastic conductive sheet according to the first embodiment illustrated in FIG. 5B.
Figure 5D:
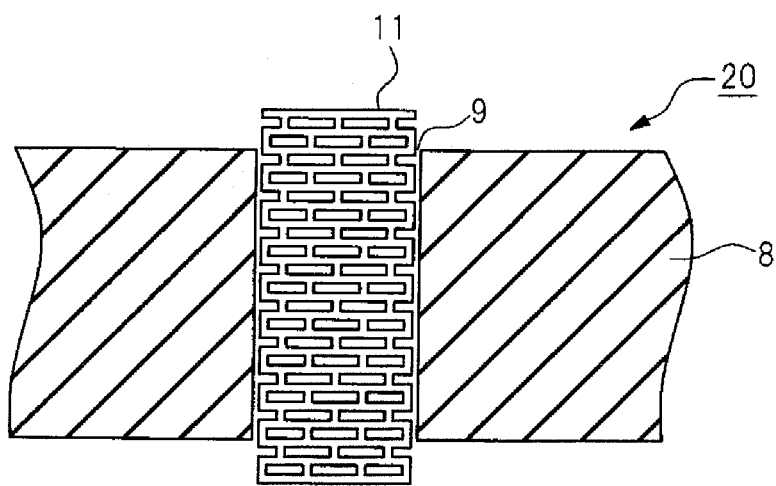
FIG. 5D is a partially enlarged sectional view of the interposer in which the mesh elastic conductive sheet according to the first embodiment illustrated in FIG. 5C is placed in one of the through holes.

FIG. 5A illustrates a mesh elastic conductive sheet 11 according to a first embodiment. In the first embodiment, a mesh structure is constituted by rectangular holes arranged in a row in the longitudinal direction and in an array in the width direction. In the array, the rectangular holes in the odd number lines are displaced from those in the even number lines by the half length of each the rectangular holes. FIG. 5B illustrates a cylindrical mesh elastic conductive sheet 11 of FIG. 5A rolled up and joined at longitudinal edges thereof. FIG. 5C is a side view of the cylindrical mesh elastic conductive sheet 11 according to the first embodiment illustrated in FIG. 5B. FIG. 5D illustrates the interposer 20 in which the mesh elastic conductive sheet 11 according to the first embodiment illustrated in FIG. 5C is placed in one of the through holes 9.

Figure 6A:
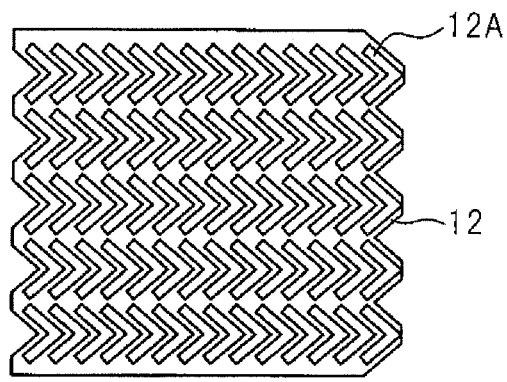
FIG. 6A is a plan view of a mesh structure of the mesh elastic conductive sheet according to a second embodiment.
Figure 6B:
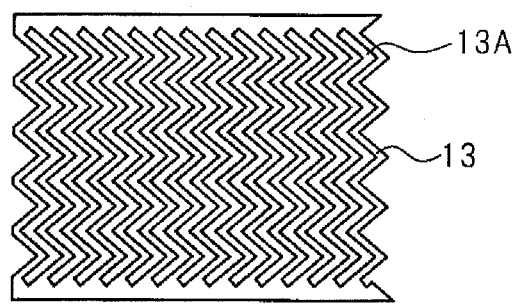
FIG. 6B is a plan view of a mesh structure of the mesh elastic conductive sheet according to a third embodiment.
Figure 6C:
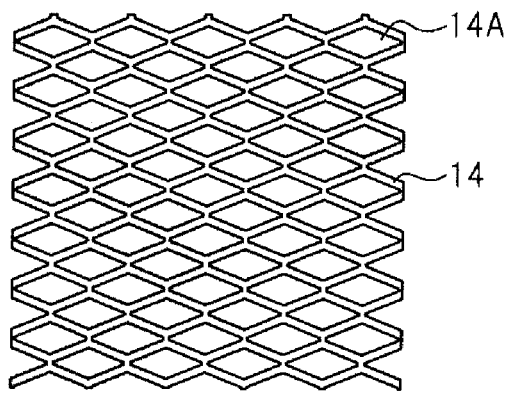
FIG. 6C is a plan view of a mesh structure of the mesh elastic conductive sheet according to a fourth embodiment.

FIG. 6A illustrates a mesh elastic conductive sheet 12 according to a second embodiment of the present application. In the second embodiment, a mesh structure is constituted by V-shaped holes 12A arranged in a row in the longitudinal direction and in an array in the width direction. FIG. 6B illustrates a mesh elastic conductive sheet 13 according to a third embodiment of the present application. In the third embodiment, a mesh structure is constituted by zigzag slits 13A arranged in a row in the longitudinal direction. FIG. 6C illustrates a mesh elastic conductive sheet 14 according to a fourth embodiment of the present application. In the fourth embodiment, a mesh structure is constituted by rhombus holes 14A arranged with their oblique sides adjoining one another.

As described above, the mesh elastic conductive sheet 10 used in the present application may include various mesh structures as illustrated in the first to fourth embodiments. With each of the structures, the mesh elastic conductive sheet 10 rolled up and placed in the through hole 9 may be compressed in the vertical direction when pressed in the vertical direction.

Figure 7A:
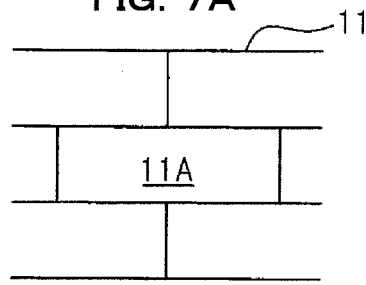
FIG. 7A is a partially enlarged plan view of the mesh elastic conductive sheet according to the first embodiment.
Figure 7B:
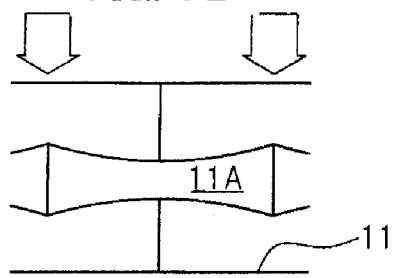
FIG. 7B illustrates the mesh elastic conductive sheet according to the first embodiment illustrated in FIG. 7A deformed under pressure.
Figure 7C:
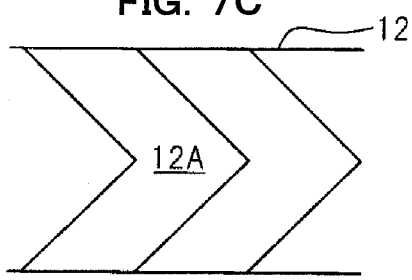
FIG. 7C is a partially enlarged plan view of the mesh elastic conductive sheet according to the second embodiment.
Figure 7D:
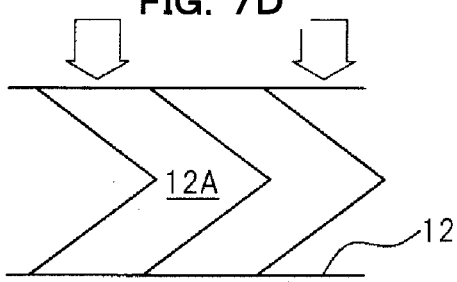
FIG. 7D illustrates the mesh elastic conductive sheet according to the second embodiment illustrated in FIG. 7C deformed under pressure.

This requirement is satisfied by any of the mesh elastic conductive sheets 11 to 14 according to the first to fourth embodiments illustrated in FIGS. 5A to 5D and 6A to 6C. In the mesh elastic conductive sheet 11 according to the first embodiment illustrated in FIG. 7A, beams constituting the mesh structure bend in the vertical direction to absorb pressure force as illustrated in FIG. 7B when the mesh elastic conductive sheet 11 is pressed in the vertical direction. In the mesh elastic conductive sheet 12 according to the second embodiment illustrated in FIG. 7C, beams constituting the mesh structure moves in the lateral direction as illustrated in FIG. 7D to absorb pressure force when the mesh elastic conductive sheet 12 is pressed in the vertical direction.

Figure 7E:
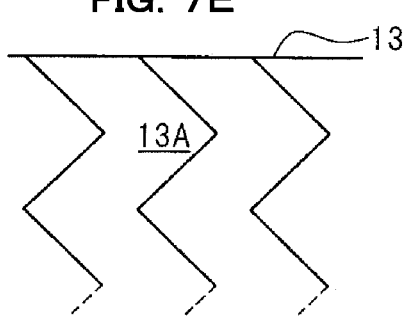
FIG. 7E is a partially enlarged plan view of the mesh elastic conductive sheet according to the third embodiment.
Figure 7F:
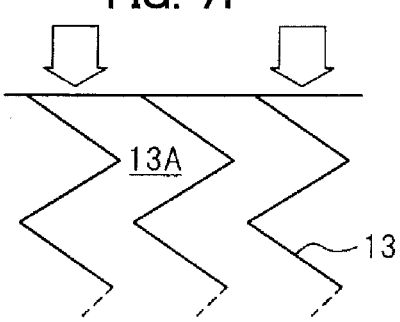
FIG. 7F illustrates the mesh elastic conductive sheet according to the third embodiment illustrated in FIG. 7E deformed under pressure.
Figure 7G:
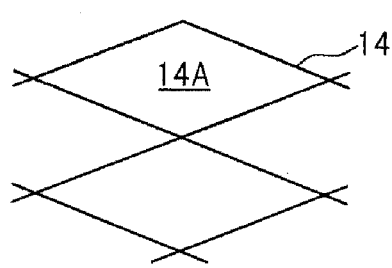
FIG. 7G is a partially enlarged plan view of the mesh elastic conductive sheet according to the fourth embodiment.
Figure 7H:
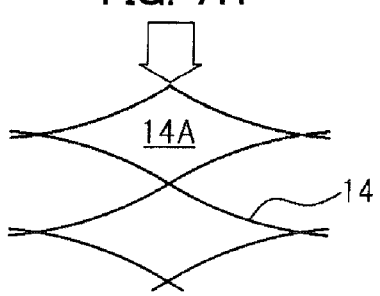
FIG. 7H illustrates the mesh elastic conductive sheet according to the fourth embodiment illustrated in FIG. 7G deformed under pressure.

In the mesh elastic conductive sheet 13 according to the third embodiment illustrated in FIG. 7E, the slits 13A are compressed along their lengths as illustrated in FIG. 7F to absorb pressure force when the mesh elastic conductive sheet 13 is pressed in the vertical direction. In the mesh elastic conductive sheet 14 according to the fourth embodiment illustrated in FIG. 7G, beams constituting the mesh structure bend in the vertical direction to absorb pressure force as illustrated in FIG. 7H when the mesh elastic conductive sheet 14 is pressed in the vertical direction.

As described above, the interposer related to the present application provides stability in multi-pin connection and high reliability with a simple structure. Thus the interposer according to the present application improves signal quality and reliability in mounted stacks of high speed and large sized packages, which may help develop devices of higher speed and higher density.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An interposer for connecting a semiconductor and a circuit board, comprising:
an insulating material sheet;
a through hole formed in the insulating material sheet; and
an elastic conductive contact formed from an elastic conductive sheet and provided in the through hole, wherein the elastic conductive contact is placed in the through hole in such a manner that one end protrudes from an upper surface of the insulating material sheet and the other ends protrude from a lower surface of the same.

2. The interposer according to claim 1, wherein
the elastic conductive sheet is rolled up to form the elastic conductive contact.

3. The interposer according to claim 2, wherein
a longitudinal dimension of the elastic conductive sheet is equal to an inner circumferential length of the through hole, and
the elastic conductive sheet is joined at longitudinal edges thereof.

4. The interposer according to claim 2, wherein
a longitudinal dimension of the elastic conductive sheet is more than twice as long as an inner circumferential length of the through hole.

5. The interposer according to claim 1, wherein
the elastic conductive sheet is a mesh conductive sheet.

6. The interposer according to claim 1, wherein
a width dimension of the elastic conductive sheet is larger than a thickness of the insulating material sheet, and
a longitudinal dimension of the elastic conductive sheet is longer than an inner circumferential length of the through hole.

7. The interposer according to claim 1, wherein
the through hole is polygonal-shaped in cross section, and
a longitudinal dimension of the elastic conductive sheet is equal to a circumference of an inscribed circle of the polygon.

8. The interposer according to claim 1, wherein
the through hole is oval-shaped in cross section, and
a longitudinal dimension of the elastic conductive sheet is equal to a circumference of the oval.

9. The interposer according to claim 1, wherein
one or more openings are provided on the elastic conductive sheet.

10. The interposer according to claim 1, wherein
a plurality of openings are arranged in grid array pattern on the elastic conductive sheet, and
each of the opening is rectangular in shape.

11. The interposer according to claim 1, wherein
a plurality of V-shaped openings are arranged in grid array pattern on the elastic conductive sheet.

12. The interposer according to claim 1, wherein
one or more zigzag slits are arranged in a row in the longitudinal direction on the elastic conductive sheet.

13. The interposer according to claim 1, wherein
the elastic conductive sheet is being hold up and provided in the through hole.

14. An electronic device comprising:
a semiconductor;
a circuit board; and
an interposer for connecting the semiconductor and the circuit board, comprising:
an insulating material sheet;
a through hole formed in the insulating material sheet; and
an elastic conductive contact formed from an elastic conductive sheet and provided in the through hole, wherein the elastic conductive contact is placed in the through hole in such a manner that one end protrudes from an upper surface of the insulating material sheet and the other ends protrude from a lower surface of the same.

15. The electronic device according to claim 14, wherein
the elastic conductive sheet is rolled up to form the elastic conductive contact.

16. The electronic device according to claim 14, wherein the elastic conductive sheet is a mesh conductive sheet.

17. The electronic device according to claim 14, wherein
a width dimension of the elastic conductive sheet is larger than a thickness of the insulating material sheet, and
a longitudinal dimension of the elastic conductive sheet is longer than an inner circumferential length of the through hole.

18. The electronic device according to claim 14, further comprising:
a socket mounted on the circuit board,
wherein the interposer is attached to an inner side of the socket.

\* \* \* \* \*